United States Patent [19]
Lowery et al.

[11] Patent Number: 5,514,627
[45] Date of Patent: May 7, 1996

[54] METHOD AND APPARATUS FOR IMPROVING THE PERFORMANCE OF LIGHT EMITTING DIODES

[75] Inventors: Christopher H. Lowery, Fremont; David K. McElfresh, Union City, both of Calif.; Steve Burchet, Cedar Crest, N.M.; Douglas B. Adolf, Albuquerque, N.M.; James Martin, Tijeras, N.M.

[73] Assignee: Hewlett-Packard Company, Palo Alto, Calif.

[21] Appl. No.: 186,196

[22] Filed: Jan. 24, 1994

[51] Int. Cl.⁶ .................................................. H01L 21/60
[52] U.S. Cl. .............................. 437/209; 437/2; 437/211; 437/214; 437/215; 437/219
[58] Field of Search .................................. 437/209, 211, 437/214, 217, 219, 220, 215, 2, 3

[56] References Cited

U.S. PATENT DOCUMENTS

| | | | |
|---|---|---|---|
| 3,760,237 | 9/1973 | Jaffee | 437/215 |
| 4,126,822 | 11/1978 | Wahlstrom | 322/2 A |
| 4,334,733 | 6/1982 | Takeshima et al. | 385/141 |
| 5,091,045 | 2/1992 | Froning et al. | 156/633 |
| 5,101,264 | 3/1992 | Kanuchi et al. | |
| 5,126,826 | 6/1992 | Kanuchi et al. | |
| 5,302,438 | 4/1994 | Komamura et al. | 428/195 |
| 5,338,704 | 8/1994 | Imai et al. | 437/217 |

FOREIGN PATENT DOCUMENTS 52-72196  6/1977  Japan.

OTHER PUBLICATIONS

Kirk–Othmer, "Encyclopedia of Chemical Technology", vol. 20 3rd Edition, Wiley–Interscience Publication, New York, 1982.

*Primary Examiner*—Kevin M. Picardat

[57] ABSTRACT

A method for increasing the resistance of a light emitting diode and other semiconductor devices to extremes of temperature is disclosed. During the manufacture of the light emitting diode, a liquid coating is applied to the light emitting die after the die has been placed in its lead frame. After the liquid coating has been placed on the die and its lead frames, a thermosetting encapsulant material is placed over the coating. The operation that cures the thermosetting material leaves the coating liquid intact. As the die and the encapsulant expand and contract at different rates with respect to changes in temperature, and as in known light emitting diodes the encapsulating material adheres to the die and lead frames, this liquid coating reduces the stresses that these different rates of expansion and contraction normally cause by eliminating the adherence of the encapsulating material to the die and frame.

7 Claims, 4 Drawing Sheets

5,514,627

METHOD AND APPARATUS FOR IMPROVING THE PERFORMANCE OF LIGHT EMITTING DIODES

BACKGROUND OF THE INVENTION

The present invention relates generally to the field of semiconductor device fabrication. More specifically it relates to the manufacture of Light Emitting Diodes ("LED"s).

LEDs are known. During their manufacture they are typically encapsulated in epoxies, polyesters or similar thermosetting materials to protect them from the environment. This encapsulation has been done on both individual LEDs and groups of LEDs fabricated together to form displays, lamps, and other devices.

During the manufacture of semiconductors, including LEDs, it is common to apply a coating to the die before encapsulating it. The purpose of this coating is to serve as a barrier layer, preventing moisture and other materials from contacting the die and damaging it. These coatings vary from a soft gel to a hard shell with a glass transition temperature ("Tg") of 180° C. or more.

In operation, changes in the temperature that the LED is exposed to place stress on the semiconductor die that comprises the light emitting component of the LED. These stresses are caused by the different expansion rates of the various material which comprise the LED when they are exposed to environmental extremes. These stresses are known to damage the die and to reduce the light output of the LED severely in certain circumstance, particularly when the LED is exposed to extremes of temperature.

Although a great deal of effort has been expended in trying to eliminate or counteract the effects of these stresses on the die, no wholly satisfactory solution has yet been discovered. The coatings used to date have not succeeded in eliminating these problems. With gelled coatings, separation frequently occurred at the interface with the thermoset, causing a light trap which reduces the light output. Other failure modes including bond wire breaks were caused by these coatings.

SUMMARY OF THE INVENTION

In a first preferred embodiment, the present invention comprises a method for relieving the stresses placed on the die by the thermosetting encapsulating material by applying a liquid coating to the die before applying the thermosetting encapsulant. This liquid coating does not set during the curing cycle of the encapsulant and remains liquid throughout the life of the LED. It also does not mix with the encapsulating material. The coating eliminates the stresses placed on the die from the combined effects of the differential expansion rates of the die and the encapsulant and the encapsulant's great adhesive strength when contacting the die. Incorporation of the liquid coating in the LEDs' manufacturing process has greatly increased the operating life of the LED at extremes of temperature.

The present invention will now be described in detail with reference to the figures listed and described below.

BRIEF DESCRIPTION OF THE ILLUSTRATIONS

DETAILED DESCRIPTION OF THE PREFERRED EMBODIMENT

Figure 1:
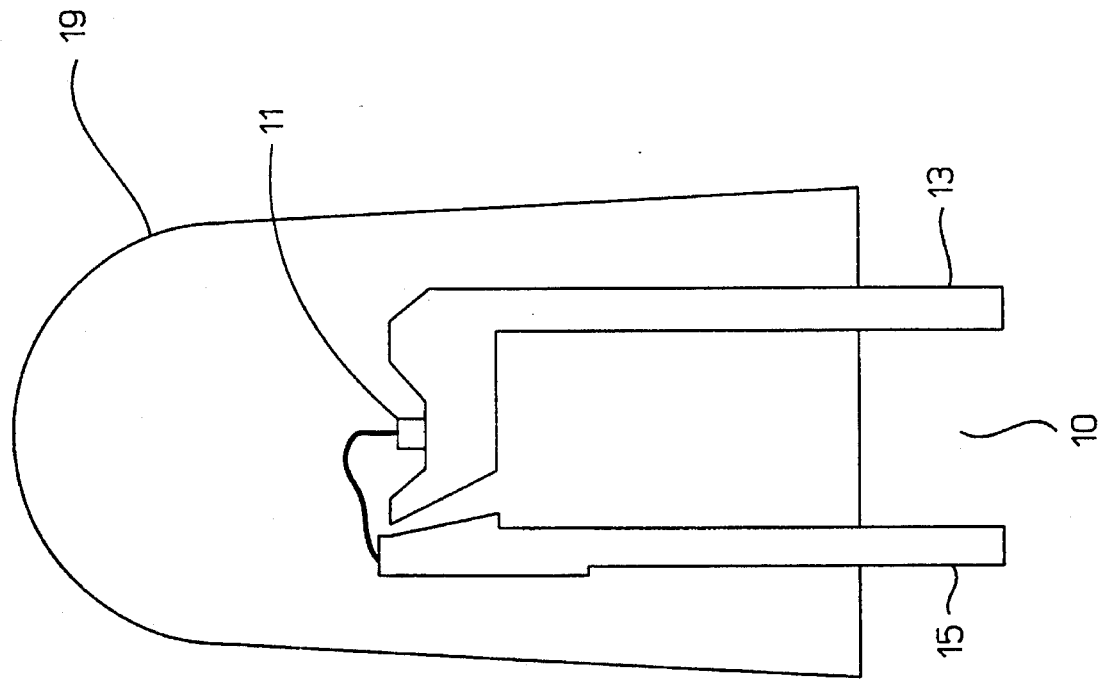
FIG. 1 is a cross-section of a known LED.

An LED constructed using known techniques is shown in FIG. 1. LED 10 is comprised of die 11, which comprises the actual light emitting semiconductor material, first lead frame 13, second lead frame 15, and housing 19, which is comprised of an epoxy, polyester, or similar thermosetting clear or tinted encapsulant.

In operation, LEDs such as that shown in FIG. 1 frequently fail or exhibit extremely poor light output at extremes of temperature. Until recently, the exact cause for these failures has been unknown.

As a result of research conducted by the inventors herein, it was discovered that the stress imposed on the die is directly related to the adhesion of the encapsulating material to the die and/or to the lead frames. The adhesion strength of the encapsulant to the die was measured and found to be higher than the adhesion strength of the encapsulant to all the other construction materials of the LED, with the exception of the die attach epoxy. In fact, the adhesion strength of the encapsulant exceeded the strength of the die. As the epoxy encapsulant shrinks more than the metal lead frames or die when cooled, the stress placed on the die from this differential rate of shrinkage in conjunction with the great adhesive strength of the encapsulant frequently destroyed the LED.

From this discovery, it became clear that the elimination of the stress imposed on the die by the encapsulant material would dramatically improve the life of the LED. To that end, the inventors developed a liquid coating which is applied to the die and lead frames during manufacture and which remains in liquid state during the curing cycle of the thermoset encapsulant. This liquid coating is substantially immiscible in the thermosetting encapsulant.

Figure 2:
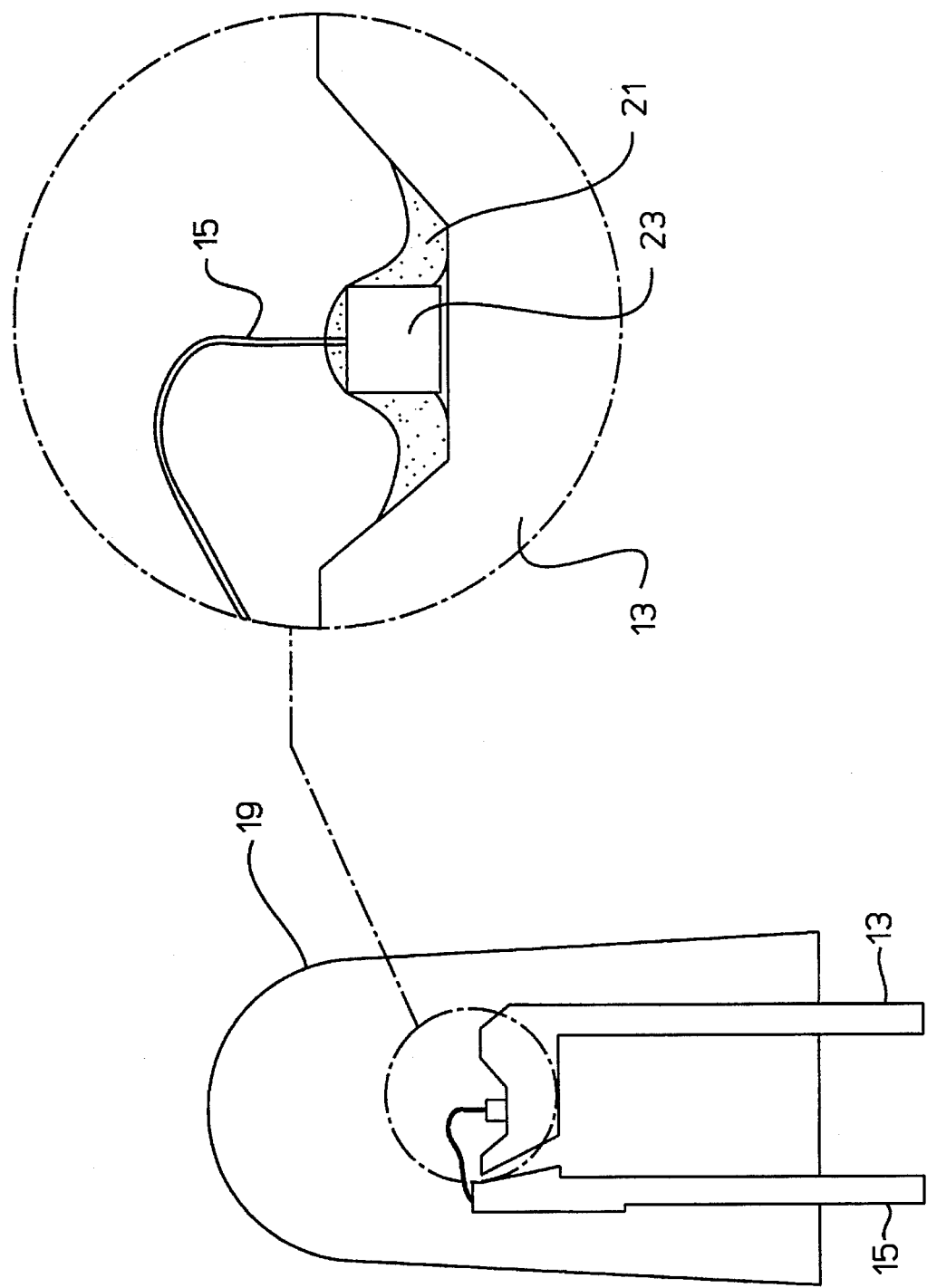
FIG. 2 is a cross-section of an LED whose construction incorporates the teachings of the present invention.

As shown in FIG. 2, coating 21 is applied to die 23 and lead frames 13 and 15. The amount of coating 21 used can be greater than a mere wetting of the surfaces of die 21 and lead frames 13 and 15. It has been found during tests of various LEDs fashioned according to the teachings of the present invention that allowing the amount of coating 21 to equal that shown in FIG. 2 allows an optimal improvement in the operational lifetime of the LEDs.

Unlike those coatings known from the prior art, the present coating is specifically intended to reduce adhesion of the epoxy encapsulant to the die and to the lead frames and it does so by remaining liquid during the entire operational lifetime of the LED and by not mixing with the thermoset epoxy encapsulant. Another challenge to developing the liquid coating was insuring that its refractive index was optimized for light transmission from the die to the encapsulant.

Several other properties were also required of the liquid coating. Given its contact with an electrically conductive structure, the liquid coating cannot conduct electricity. Therefore no ionic materials or materials with metallic particles could be used. Of the many materials available with the necessary properties, several types of commercially available polymeric silicone compounds proved acceptable. Polyalkylmethylsiloxane and dimethylpolysiloxane (particularly SF 1147 from GE Silicones) were found to work best.

The application of the liquid coating to the LED adds only slightly to the cost and time needed to fabricate the LED. After the electrical leads are attached to the die, which occurs after the die has been placed in its lead frame, a mask is placed over the LEDs being fabricated and the liquid coating sprayed on. A fairly thick coating is applied, as this has been found to provide the optimal thermal shock resistance to the LED.

In a first test, a die which is very sensitive to low temperatures, a 10 mil square yellow GaAsP on GaP LED die, was encapsulated in a 5 mm lamp using standard assembly techniques. A sample size of 28 lamps were used and these became the control group. At the same time, another set of 28 lamps were constructed, except this group, the test group, had their die and lead frames coated with a layer of the liquid described herein before being encapsulated. Both groups of LEDs were subjected to a Low Temperature Operating Life ("LTOL") test, during which test the LEDs received a drive current of 20 mA while being kept at −40° C. The LEDs' initial light output was measured and remeasured at intervals up to a total elapsed time of 1,000 hours.

Figure 3:
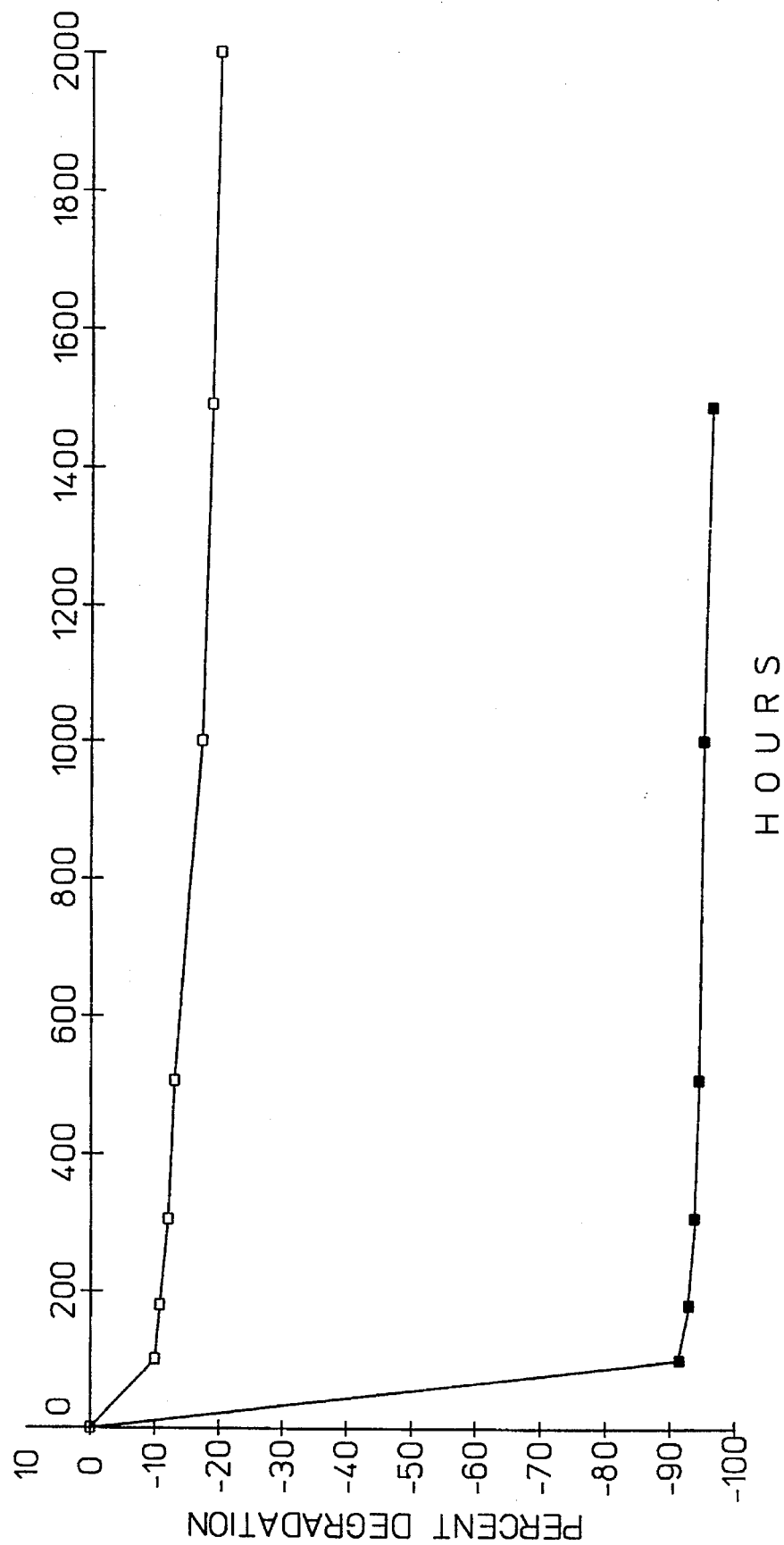
FIG. 3 is a graph showing the effects of low temperature on the operating life of both known LEDs and LEDs constructed according to the teachings of the present invention.

As shown in FIG. 3, the test did not significantly degrade the light output of LEDs built according to the present invention, even over the entire 1,000 hours of the test, while the LEDs comprising the test lot lost ·90% of their light output in six hours.

Figure 4:
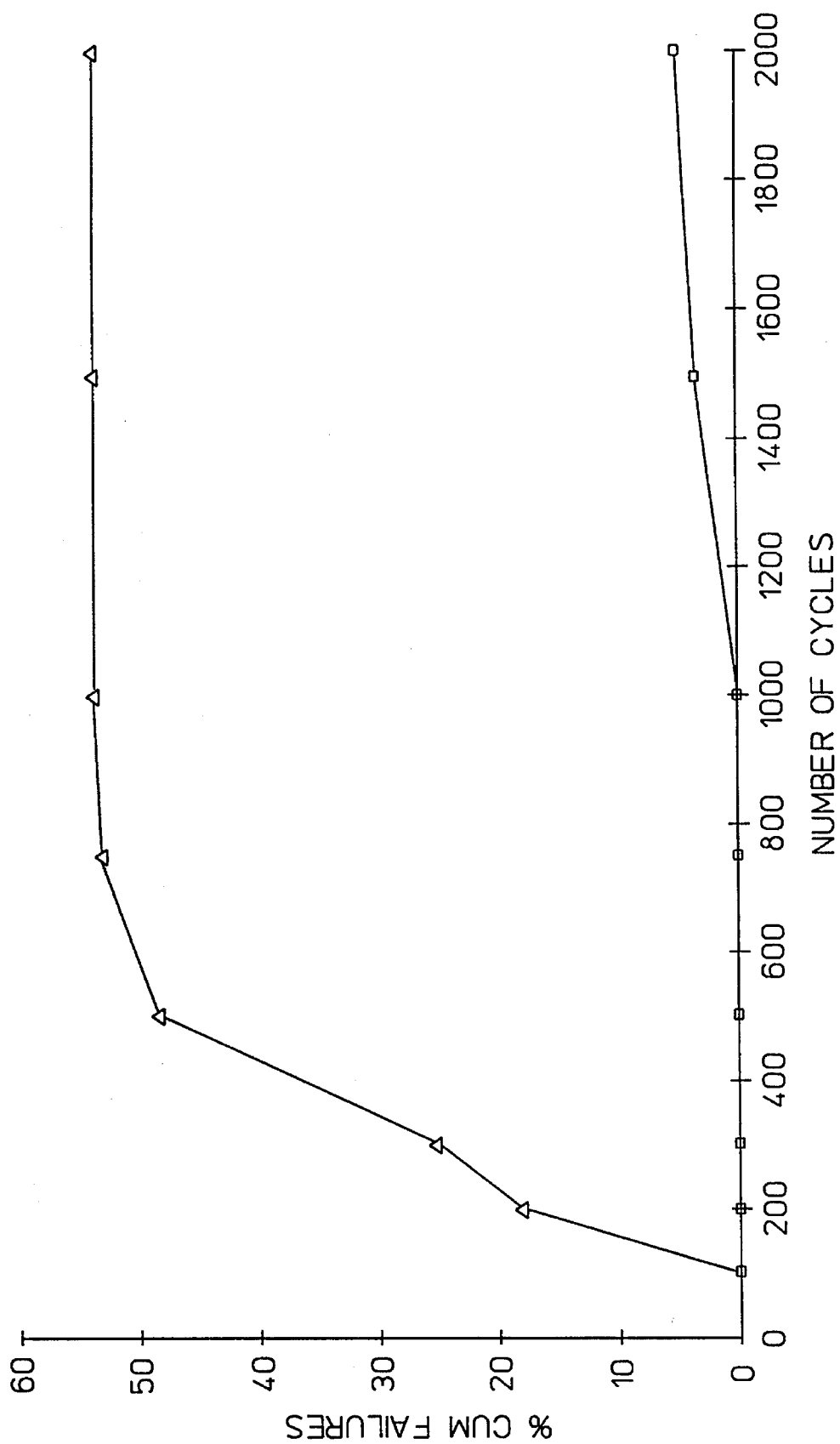
FIG. 4 is a graph showing the results of thermal shock tests applied to known LEDs and LEDs constructed according to the teachings of the present invention.

In subsequent additional tests, including further LTOL, Wet Temperature Operating Life (85° C., 85% relative humidity and 10 mA drive current), Temperature Cycle (−55° C. to 100° C.) and Thermal Shock (−40° C. to 110° C., liquid to liquid), no detrimental effect could be detected in the group of LEDs constructed according to the teachings of the present invention. The results of the thermal shock test are shown in FIG. 4. After 800 cycles, approximately 55% of the control LEDs failed. Even after 1,500 cycles, only 5% of the LEDs made according to the teachings of the present invention failed.

The present invention has now been explained with reference to a particular embodiment. It should be apparent to one skilled in the art that numerous changes and modifications may be made thereto without departing from the scope or spirit of the invention. For example, different types of liquid coatings could be used, with the coatings being optimized for the particular environment that the semiconductor device is expected to work in. Varying the amount of the liquid coating applied may also be needed to achieve optimum results in different environments and with different coating materials. Other changes, modifications and applications of the present invention will become apparent to one skilled in the art in view of this disclosure. Thus the invention should be limited only in accordance with the appended claims.

What is claimed is:

1. A method for improving the performance of a light emitting diode, the light emitting diode comprising at least a light emitting die, a first and second lead frame and an encapsulation layer, the method comprising the step of placing a liquid coating over the die after the die has been placed and coupled to the first and second lead frames, the step of placing the liquid coating over the die and lead frames preceding the step of placing the encapsulation layer over the die, the liquid coating remaining liquid throughout the lifetime of the light emitting diode.

2. The method of claim 1 wherein the liquid coating comprises a non-conductive material which is immiscible in the encapsulating layer.

3. The method of claim 2 wherein the liquid coating comprises one of the group of polyalkylmethylsiloxane, dimethylpolysiloxane, and polyarylalkylsiloxanes.

4. A method for improving the reliability performance of a semiconductor device, the semiconductor device comprising at least one active semiconductor element, the active semiconductor element being coupled to at least a first and second electrical contact, the active semiconductor element and the first and second electrical contacts being mounted in a package comprising a thermosetting material, the method comprising the step of coating the active semiconductor element and the first and second electrical contacts with a liquid coating after the electrical contacts have been coupled to the active semiconductor element and before the active semiconductor element and the electrical contacts have been encapsulated in the thermosetting material, the liquid coating remaining liquid for the entire operational life of the semiconductor device.

5. The method of claim 4 wherein the liquid coating is immiscible in the thermosetting material.

6. The method of claim 5 wherein the liquid coating comprises a polyarylalkylsiloxane material.

7. The method of claim 5 wherein the liquid coating has a refractive index approximately the same as that of the thermosetting material.

\* \* \* \* \*

UNITED STATES PATENT AND TRADEMARK OFFICE
CERTIFICATE OF CORRECTION

PATENT NO. : 5,514,627

DATED : May 7, 1996

INVENTOR(S) : Christopher H. Lowery, et al

It is certified that error appears in the above-identified patent and that said Letters Patent is hereby corrected as shown below:

Column 1, line 5, insert:

The U.S. Government has a paid-up license in this invention and the right in limited circumstances to require the patent owner to license others on reasonable terms as provided for by the terms of S80837/SD-5359 awarded by Sandia National Laboratories.

Signed and Sealed this

Third Day of April, 2001

Attest:

NICHOLAS P. GODICI

*Attesting Officer*    *Acting Director of the United States Patent and Trademark Office*